US007424117B2

(12) United States Patent
Herberger et al.

(10) Patent No.: US 7,424,117 B2
(45) Date of Patent: Sep. 9, 2008

(54) SYSTEM AND METHOD FOR GENERATING SOUND TRANSITIONS IN A SURROUND ENVIRONMENT

(75) Inventors: Tilman Herberger, Dresden (DE); Titu Tost, Dresden (DE)

(73) Assignee: Magix AG (DE)

( * ) Notice: Subject to any disclaimer, the term of this patent is extended or adjusted under 35 U.S.C. 154(b) by 747 days.

(21) Appl. No.: 10/647,494

(22) Filed: Aug. 25, 2003

(65) Prior Publication Data

US 2005/0047614 A1 Mar. 3, 2005

(51) Int. Cl.
*H03G 3/00* (2006.01)

(52) U.S. Cl. ............................ 381/61; 381/119; 700/94

(58) Field of Classification Search ................. 381/306, 381/307, 61, 119, 300, 86, 17, 18; 700/94
See application file for complete search history.

(56) References Cited

U.S. PATENT DOCUMENTS

| | | | |
|---|---|---|---|
| 1,850,130 A | 3/1932 | Gannett | |
| 2,714,633 A | 8/1955 | Fine | |
| 2,941,044 A | 6/1960 | Volkmann | |
| 3,056,854 A | 10/1962 | Katzenstein et al. | |
| 3,156,770 A | 11/1964 | Trainor | |
| 3,322,899 A | 5/1967 | Renwick, Jr. | |
| 3,665,105 A | 5/1972 | Chowning | |
| 3,757,046 A * | 9/1973 | Williams | 381/307 |
| 3,873,779 A * | 3/1975 | Wedan | 381/18 |
| 3,969,588 A * | 7/1976 | Raydon et al. | 381/307 |
| 4,819,269 A * | 4/1989 | Klayman | 381/307 |
| 5,436,975 A | 7/1995 | Lowe et al. | |
| 5,878,145 A | 3/1999 | Adams | |
| 6,430,294 B1 | 8/2002 | Fujita et al. | |
| 6,577,736 B1 * | 6/2003 | Clemow | 381/18 |
| 6,889,193 B2 * | 5/2005 | McLean | 704/500 |
| 6,977,653 B1 * | 12/2005 | Cleary et al. | 345/440 |
| 2002/0172379 A1 * | 11/2002 | Cliff | 381/119 |
| 2003/0039366 A1 | 2/2003 | Eid et al. | |
| 2004/0161126 A1 * | 8/2004 | Rosen et al. | 381/307 |

FOREIGN PATENT DOCUMENTS

| | | |
|---|---|---|
| JP | 10083190 | 3/1998 |

* cited by examiner

*Primary Examiner*—Vivian Chin
*Assistant Examiner*—Jason Kurr
(74) *Attorney, Agent, or Firm*—Fellers, Snider, Blankenship, Bailey & Tippins, P.C.; Terry L. Watt

(57) ABSTRACT

A system and method for enhancing song-to-song transitions in a multi-channel audio environment, preferably a surround environment. In the inventive method, by independently manipulating the volumes of the various channels of each program during transitions, an illusion of motion is imparted to the program which is ending to create an impression that the song is exiting while motion is imparted to the program which is starting to create an impression that the song is entering. Optionally delay may be used to further enhance the effect. In a preferred system, each audio channel includes inputs for both the ending and starting programs, independent volume controls for each program. In one preferred embodiment, the system further includes a means for imparting delay to each program and volume control for the delayed audio to provide greater depth to the illusion of motion.

30 Claims, 7 Drawing Sheets

SYSTEM AND METHOD FOR GENERATING SOUND TRANSITIONS IN A SURROUND ENVIRONMENT

BACKGROUND OF THE INVENTION

1. Field of the Invention

The present invention relates to the playing of recorded music as by a disc jockey (i.e., a "DJ" in the argot of the trade) or other entertainer. More particularly, but not by way of limitation, the present invention generally relates to enhanced song-to-song transitions when music is played through a multi-channel sound system and, preferably, in a live-music environment.

2. Background of the Invention

In an environment where people are dancing, maintaining some degree of continuity in song-to-song transitions is generally desired and, in fact, the quality of such transitions is often a measure of the professionalism of a particular production. A variety of techniques have been developed by disc jockeys to improve the continuity between songs, such as beat matching, scratching, phrase matching, pitch bending, etc. Some of these techniques fall under the general rubric of "turntablism", whereas others might be categorized as "mixing" or transition effects.

Generally, in a live performance environment as one song is approaching its conclusion, or "outro", the first beat of a second record is cued. In the event where both songs are playing on conventional turntables, and, assuming that the two songs have the same time signature, e.g., if both have a 4/4 time signature, beat matching between the starting and ending songs maybe accomplished manually by adjusting the speed of the second turntable so that the two records have an identical number of beats per minute. In other situations, for example where digitally formatted music is being played from compact disks or from songs stored as MP3 files on hard disk, such beat matching may be performed automatically by a computer according to methods well known to those of ordinary skill in the art. In either case, preferably on a down beat of the first record, the second record is started so that the beats of the two songs are synchronized as the first song ends and the second begins its intro.

Phrase matching is simply the extension of beat matching to overlap musical phrases between the two songs. Typically in songs suited for phrase matching, a song is constructed as a series of phrases, each phrase being some multiple of four bars. The continuity between songs is enhanced by beginning the beat matching process at the beginning of a phrase so that the songs overlap by an integer number of phrases.

Pitch bending is the process of modifying the speed, or tempo, of the second song to precisely match the tempo of the first song. This is performed either by adjusting the turntable speed of the second record or manually by holding back the second record with one or two fingers to produce the desired speed. While pitch bending can be used to match the speeds of two songs which are of nearly the same tempo, it is unlikely that pitch bending can be used to align two songs between which the tempo differs by more than a few beats per minute.

While these techniques are regularly mastered by DJ's, they still suffer from a number of limitations. For example, a DJ must first develop the art of turntablism. The skilled DJ must then become intimately familiar with each song to be mixed and learn which songs mix well with each other and identify phrases which will align well between songs. Even with a skilled DJ, not all songs are suitable for mixing through beat matching or phrase matching, the tempos may vary by too much, the keys may be incompatible, or the songs just may not subjectively blend well.

The terms "surround" or "surround sound" are often used to refer to audio recorded in five, or more, channels, typically: a left front channel; a center front channel; a right front channel; a right rear channel; and a left rear channel. In addition, a bass channel is sometimes provided for driving a sub-woofer to add bass sounds to a degree which may be as much about tactile perceptions as it is about audible perceptions. While conventional stereo systems impart some spatial quality to audio, providing four or more channels of audio can truly create an impression that a reproduced sound is emanating from virtually any point around a listener.

With surround audio systems, it has become a common practice to provide a number of effects which will fill all five channels even when a program has only been recorded in one or two channels. Often times, the rear channels are simply delayed from the front panel to create an illusion that seemingly transforms even a small room into a concert hall. By manipulation of volume and delay, a number of effects can be achieved in a surround system.

However, dance and listening audiences are always seeking new audio experiences and, in spite of the number of conventional transitions that might be available, there is always a need for new and interesting transition effects.

Thus it is an object of the present invention to provide a system and method for song-to-song transitions which takes advantage of the spatial quality of a stereo, surround, or other multi-channel audio system, thereby enhancing the transition between songs which might not otherwise be well suited for conventional transition methods and to improve transitions between songs which are suitable for beat matching.

Heretofore, as is well known in the music and video industries, there has been a need for an invention to address and solve the above-described problems. Accordingly, it should now be recognized, as was recognized by the present inventors, that there exists, and has existed for some time, a very real need for a device that would address and solve the above-described problems.

Before proceeding to a description of the present invention, however, it should be noted and remembered that the description of the invention which follows, together with the accompanying drawings, should not be construed as limiting the invention to the examples (or preferred embodiments) shown and described. This is so because those skilled in the art to which the invention pertains will be able to devise other forms of this invention within the ambit of the appended claims.

SUMMARY OF THE INVENTION

The present invention provides a system and method for generating sound transitions between successively played musical works in a multi-channel, or surround, environment. In a first preferred embodiment during the ending, or "outro", of a first song, the volume of each speaker is adjusted to create the audio illusion that the first/ending song is moving away from the listener in a first direction. Simultaneously, the volume of each channel of the second/beginning song is adjusted to create the audio illusion that the second song is moving toward the listener from a second direction.

In a preferred embodiment, during a song-to-song transition, whether such transition is triggered automatically or manually, the sound levels coming from a plurality of audio speakers are automatically varied so as to give an audible illusion of motion of a first song or sound source. Simultaneously, a second sound source is faded in, also in a fashion to give an audible illusion of motion.

In another preferred embodiment, in addition to providing automatic volume control of each channel, the output of each channel is delayed, or reverberated through a delay, to create an aural perception of depth to further enhance the perceived movement of the audio. Preferably, both the amount of time delayed and the volume of the delayed audio are under control of the inventive system.

In yet another preferred embodiment, sound effects may be generated and mixed with the audio programs to further enhance the perception of movement. Like the program audio, each channel of sound effect can likewise be manipulated as to volume and delay.

In still another preferred embodiment, there is provided a method substantially as described above, but wherein the sound spatial distribution is displayed graphically in real time on an attached video monitor. That is, in a preferred variation a computer with attached monitor will be programmed to display a graphical representation of the spatial distribution of the song or songs that are currently playing. Preferably, this display will be continuously updated to give a visual presentation of the sound distribution among the plurality of speakers.

The foregoing has outlined in broad terms the more important features of the invention disclosed herein so that the detailed description that follows may be more clearly understood, and so that the contribution of the instant inventors to the art may be better appreciated. The instant invention is not to be limited in its application to the details of the construction and to the arrangements of the components set forth in the following description or illustrated in the drawings. Rather, the invention is capable of other embodiments and of being practiced and carried out in various other ways not specifically enumerated herein. Additionally, the disclosure that follows is intended to apply to all alternatives, modifications and equivalents as may be included within the spirit and scope of the invention as defined by the appended claims. Further, it should be understood that the phraseology and terminology employed herein are for the purpose of description and should not be regarded as limiting, unless the specification specifically so limits the invention. Further objects, features, and advantages of the present invention will be apparent upon examining the accompanying drawings and upon reading the following description of the preferred embodiments.

DESCRIPTION OF THE PREFERRED EMBODIMENTS

Figure 1:
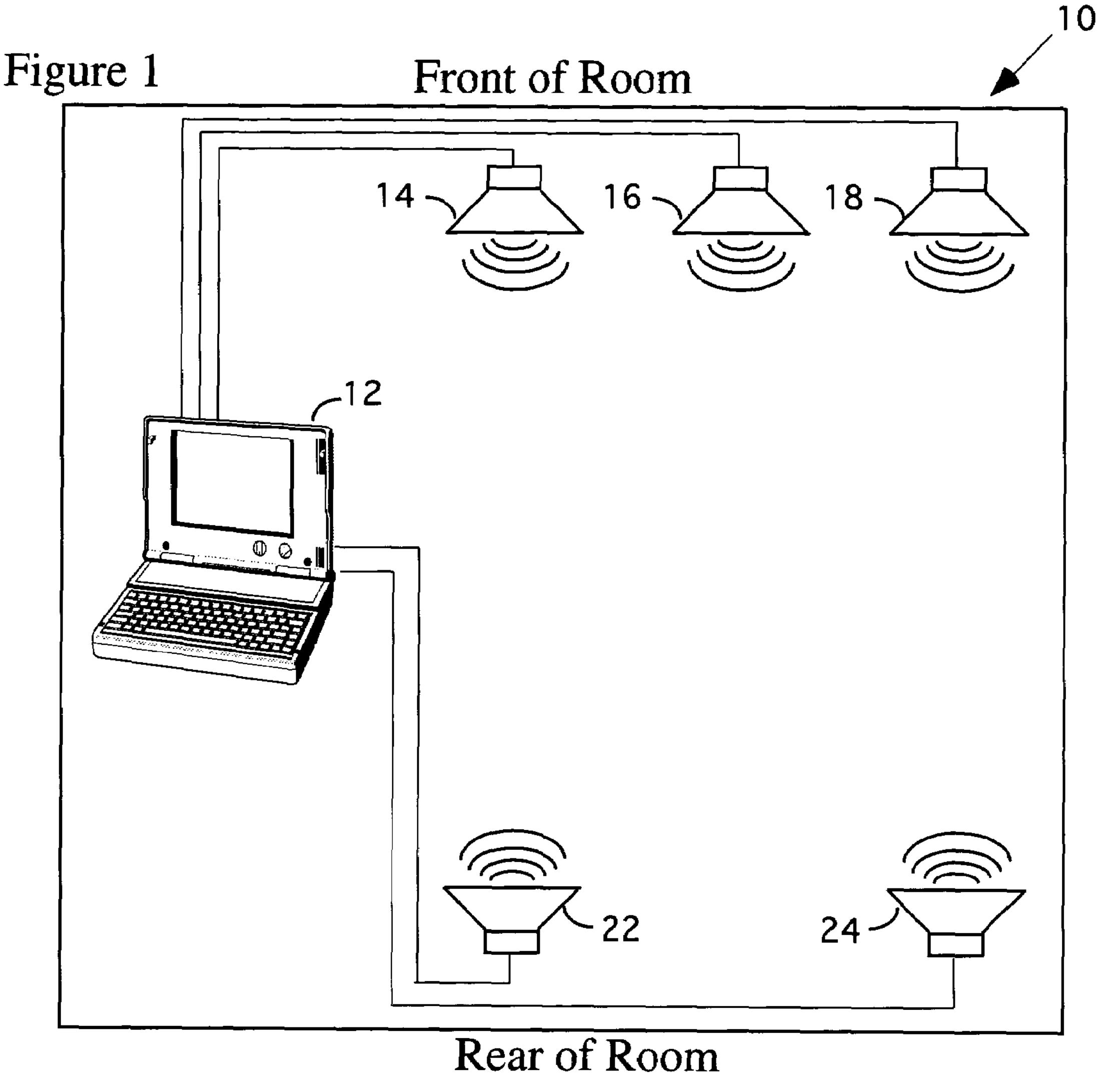
FIG. 1 depicts the present invention in its general environment.

Referring now to the drawings, wherein like reference numerals indicate the same parts throughout the several views, a preferred system for generating sound transitions 10 is shown in its general environment in FIG. 1. In a preferred embodiment, system 10 comprises a computer 12 which reads and decodes an audio source, typically music, from a digital media. The audio program reproduced by computer 12 drives a multi-channel sound system, such as a five channel system in a surround environment. That being said, as is described hereinafter it should be clear to those of ordinary skill in the art that the instant invention would also work with an analog sound source (such as one or more conventional turntables) and that this aspect of the computer's role in this process (i.e., functioning as a sound source) could be accomplished in many other ways.

Note that, for purposes of the present invention, the term "surround" or "surround sound" conventionally refers to audio systems having three or more channels. Presently available surround systems often provide five channels, namely: a left front channel 14; a center channel 16; a right front channel 18; a right rear channel 20; and a left rear channel 22. In addition, many systems provide a single bass channel to fill in lower frequencies. While the present invention is not limited to such systems, it is worth noting that a significant amount of programming is now recorded in five channels and that many such audio systems often synthesize the additional channels when a stereo program is played over the system. Accordingly, the preferred embodiment is discussed with reference to a five channel system. That being said, fewer number of channels could certainly be used in implementing the instant invention, although it should be noted that at least two such channels are necessary to create the intended effect.

The present invention provides a system and method for song-to-song transitions in a multi-channel audio environment. While the present invention can be used to enhance the quality of transitions when used in combination with other methods, i.e. beat matching and the like, it is particularly well suited to providing continuity to song-to-song transitions where traditional methods fail, i.e., disparate tempos, incompatible keys, etc. In a song-to-song transition performed according to the present invention, through manipulation of the volume of individual channels, and optionally the introduction of delay and/or sound effects, an aural illusion is created that the first song is exiting in a first direction while a new song is ushered in from a second direction.

Figure 6A:
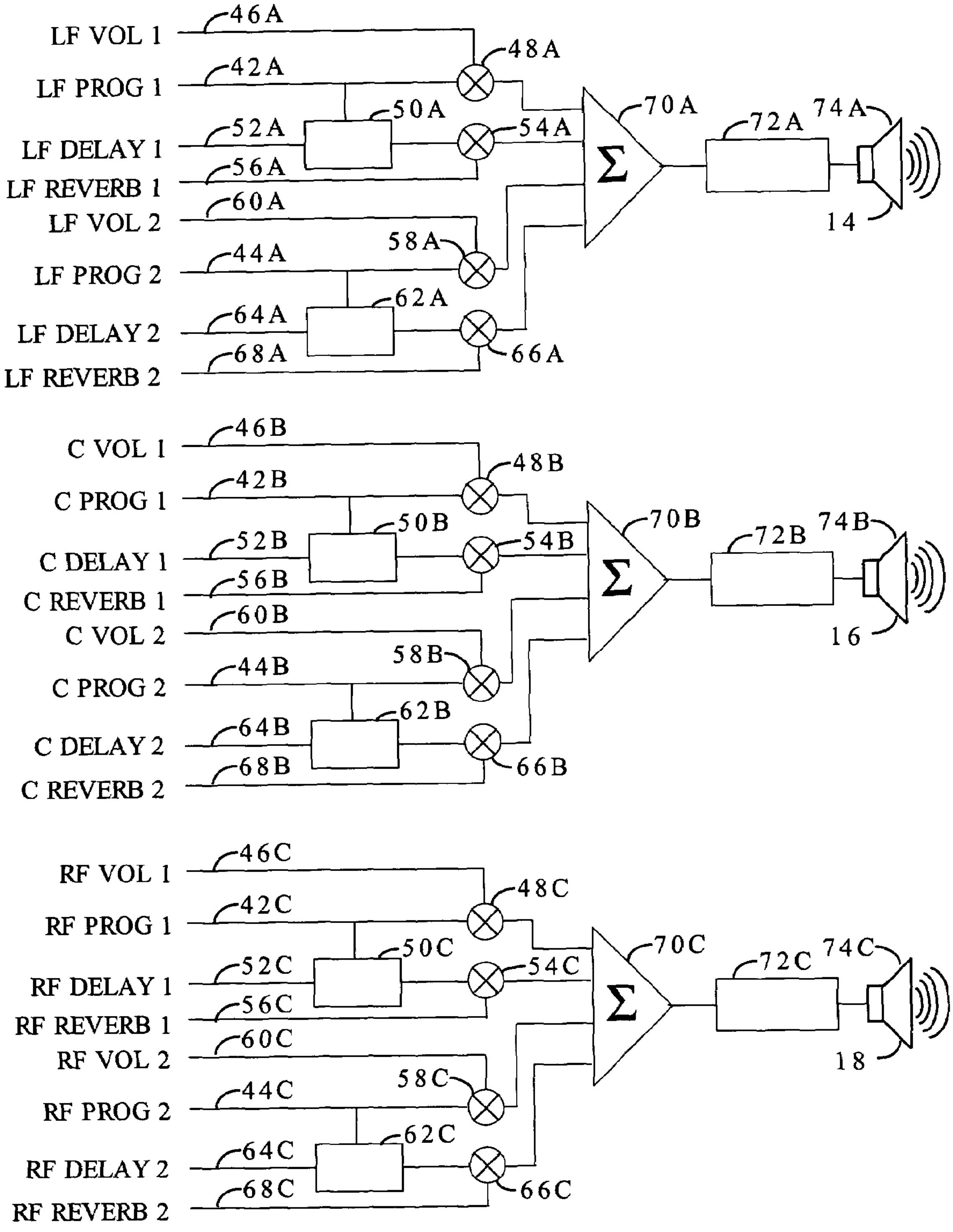
FIGS. 6A and 6B provide a block diagram of a preferred system for controlling audio transitions according to the present invention.
Figure 6B:
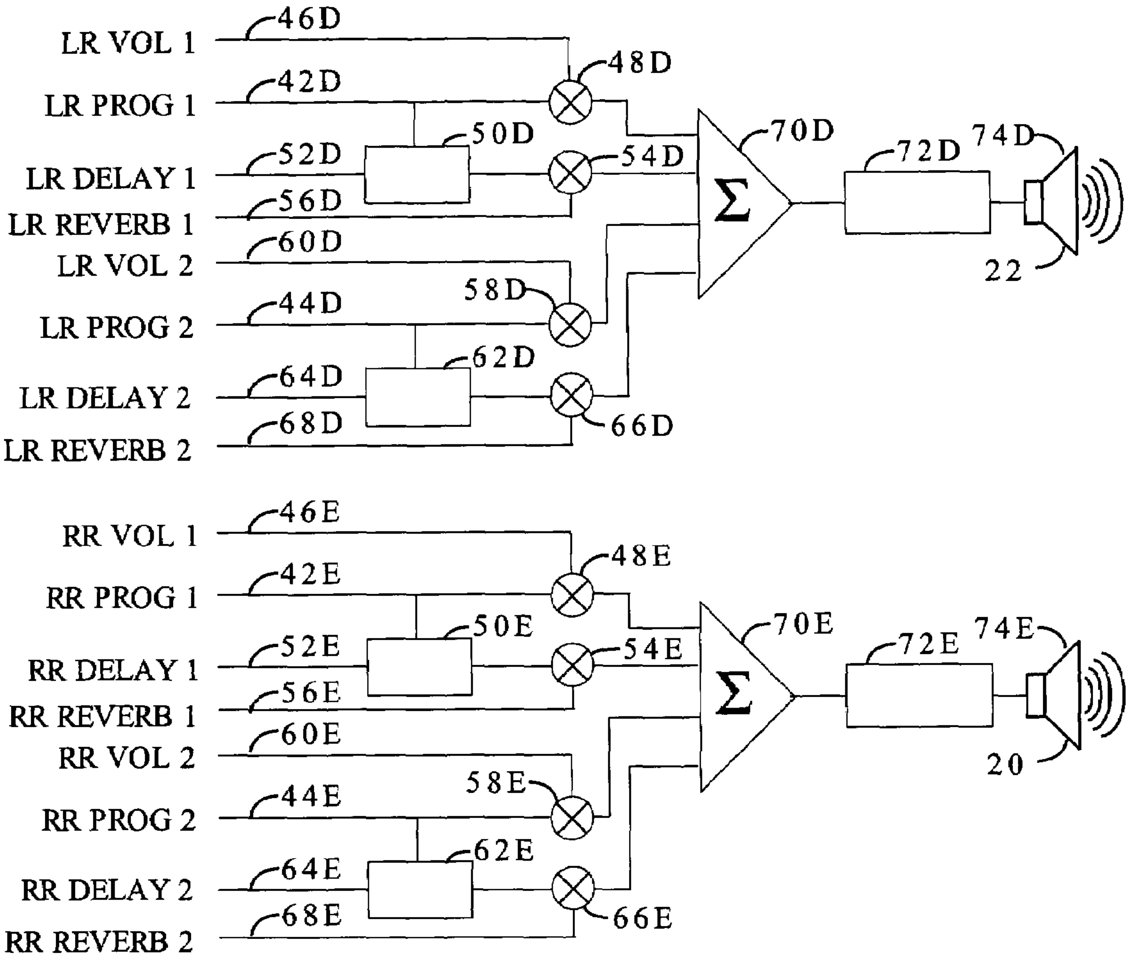

To manipulate sound according to the present invention, system 20 must be able to control the volume of each channel of potentially overlapping audio programs. Optionally, it may be desirable for the system 20 to also control the delay in the audio and the volume of the delayed audio, as in creating a reverb effect, to further the illusion of depth. A diagram of a preferred system 20 for manipulating audio according to the present invention is shown in FIGS. 6A and 6B. As in FIG. 1, for the sake of explanation, the channels are herein referred to as left front 14, center 16, right front 18, right rear 20, and left rear 22.

In left front channel 14, provision is preferably made for inputting a first audio program at 42*a* and inputting a second audio program at 44*a*. As will be apparent to those skilled in the art, the act of controlling volume is essentially a scaling operation, or multiplying, performed on the incoming audio program. To control the volume of the first program audio, the audio signal is scaled by its volume control signal 46*a* at multiplier 48*a*. The first program audio is also preferably routed through a time delay means 50*a* which delays the audio by a duration specified by input 52*a*. The volume of the delayed audio is then set by multiplier 54*a* as controlled by input 56*a*.

Likewise, the volume of the left front channel of the second program audio is preferably set by multiplier 58*a* under the control of volume input 60*a*. Delay may also be imparted to the second program audio by delay means 62*a* as controlled by input 64*a*. The volume of the delayed audio is set at multiplier 66*a* under the control of input 68*a*. The outputs of the four multipliers are then mixed in summing amplifier 70*a* and directed to power amplifier 72*a* to produce audio at speaker 74*a*.

As will be apparent to those skilled in the art, volume control and delay can be accomplished in a number of different fashions, virtually all of which are suited for use in the present invention. By way of example and not limitation, volume control can be accomplished with an analog multiplier, in a multiplying digital to analog converter, through a digital pot, and the like. However, as will also be apparent to those skilled in the art, since virtually all audio is now recorded in a digital form, or later converted and stored in a digital form, volume control can be can be accomplished without additional hardware components by simply multiplying each sample of the audio signal by a scalar value which is representative of the desired volume.

In a similar vein, a number of delay techniques are well known in the art and commonly employed to create a reverb effect. By way of example and not limitation, such techniques include mechanical delay lines, bucket-brigade integrated circuits, and the like. Again, when the signal is available in a digital form in a computer, delay can also be accomplished within the computer without the need for external hardware. Software delay techniques are well known in the art and simply require enough memory to buffer the digital audio between the normal playback time and the delay time, e.g., the memory required to buffer delayed audio in an uncompressed form is given by: sample size (typically two bytes per channel)*sample rate (given in samples per second)*length of delay (given in second).

Like volume control and delay, mixing can easily be performed in software through techniques which are well known in the art, such as simply adding the results obtained after the volume control operations. Accordingly, all of the audio processing required to practice the present invention can be performed in dedicated hardware, in software, or some combination of hardware and software.

Continuing with FIGS. 6A and 6B it can be seen that each of the remaining channels likewise includes: inputs for first and second program audio 42*b-e* and 44*b-e*, respectively; volume control inputs for each program 46*b-e* and 60*b-e*; volume control means for each program 48*b-e* and 58*b-e*, respectively; delay means for each program 50*b-e* and 62*b-e*; delay control inputs 52*b-e* and 64*b-e*; volume control means for the delayed audio 54*b-e* and 66*b-e*; volume control inputs for the delayed audio 56*b-e* and 68*b-e*; mixer 70*b-e* for mixing un-delayed and delayed audio from the first and second programs; power amplifier 72*b-e*; and loudspeaker 74*b-e*. Operation of channels 16-22 is identical to that the left front channel 14 described hereinabove.

It should be noted that system 20 depicted in FIGS. 6A and 6B is somewhat limited in its ability to produce the desired effect during song-to-song transitions (or, more generally, transitions between two audio works) in that the system relies on having meaningful audio content available in every channel as each song winds-up and the next song starts-up. Obviously if there is no audio in a channel at the time the effect is wanted, system 20 cannot create the desired effect. This drawback is overcome in a somewhat more versatile, but more complex, system, as partially shown in FIG. 7, wherein the audio from all channels may be mixed into any individual channel.

Figure 7:
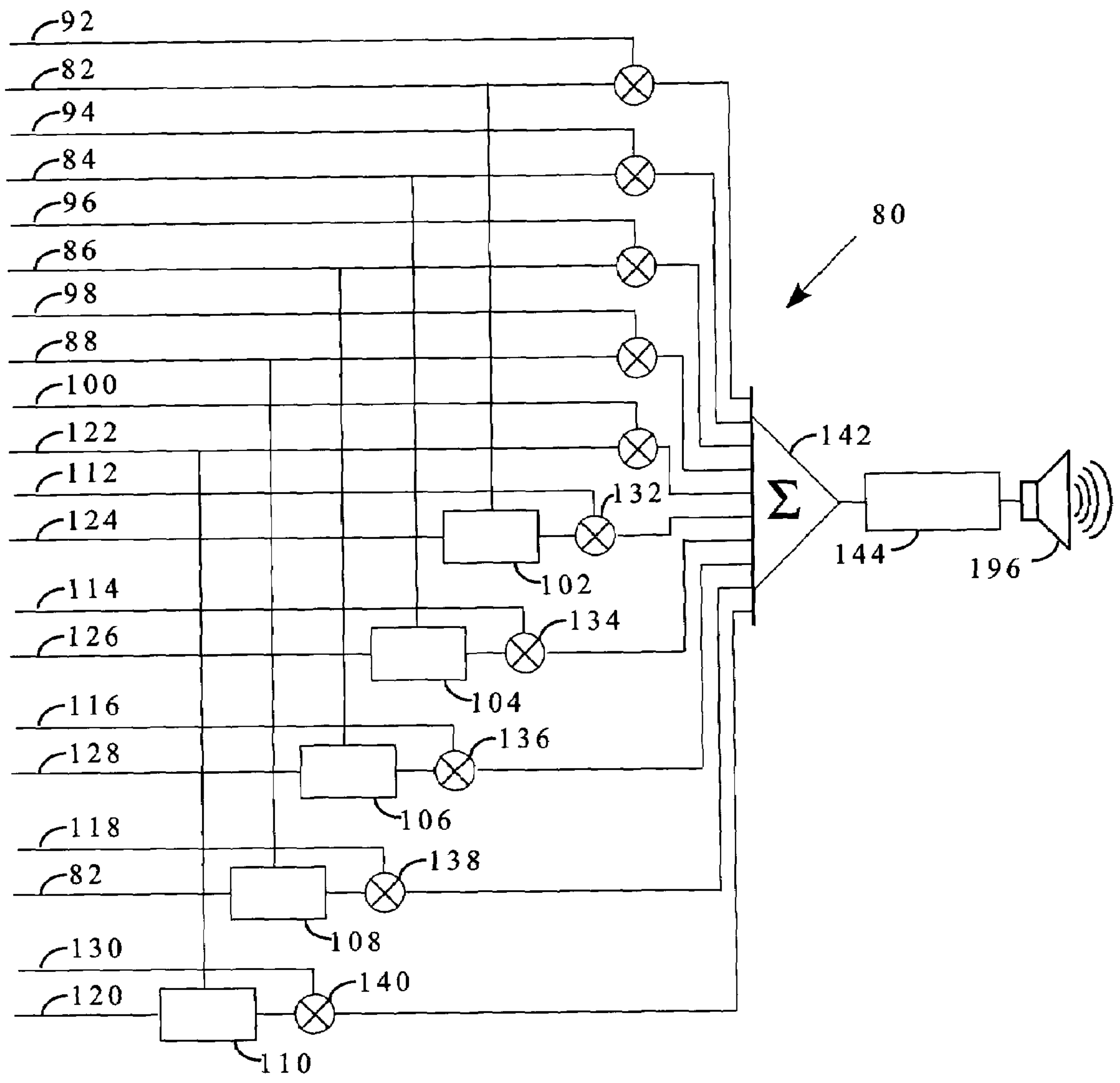
FIG. 7 provides a block diagram of another preferred system for controlling audio transitions according to the present invention.

By way of example, the process of controlling all channels of the first program audio through one output channel could be performed according to the first program audio path 80 depicted in FIG. 7. Preferably first program audio path 80 includes: audio inputs 82-90 for inputting first program audio from all five channels of the source; volume control inputs 92-100 for independently controlling the volumes of each input; delay means 102-110, delay control inputs 112-120, and delayed audio volume control inputs 122-130 for controlling delayed versions of the audio from inputs 82-90 in volume controls 132-140; mixer 142; amplifier 144; and loudspeaker 146.

As will be apparent to those skilled in the art, particularly in light of discussion with regards to system 20 of FIGS. 6A and 6B, not shown in FIG. 7 are the functions associated with the second program audio, i.e., five audio inputs, volume controls, delay controls, and delayed audio volume controls, which are duplicates of those provided with regard to the first program audio inputs. Processed second program audio is likewise summed through mixer 142. Further, in keeping with the symmetry of system 20, the entire audio path, as described for the first and second program audio, is then replicated for the four other channels. Thus, the audio directed to any speaker during a song-to-song transition can contain audio programming from any channel, at any volume and any delay needed to create a desired effect.

Figure 2:
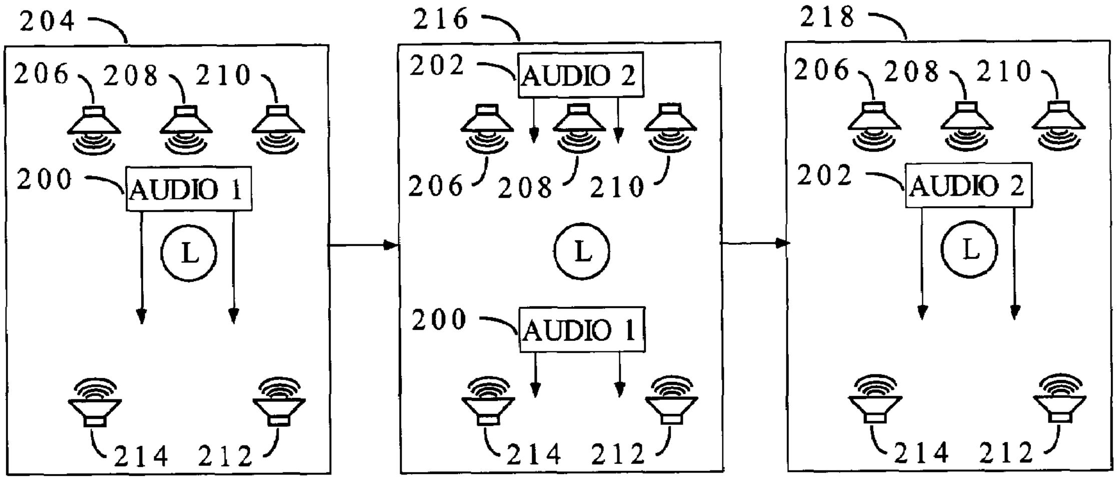
FIG. 2 provides a diagram of the perceived movement of audio programs in a first example.

As mentioned above, song-to-song transitions are enhanced in accordance with the present invention by controlling the relative volume, an d optionally delay of the program, in the various channels of a multi-channel audio system to create an illusion that the audio program is moving away from the listener while a second, possibly overlapping, program is moved toward the user. Tuning then FIG. 2, in a first example, as the first audio program 200 is ending, a transition to the second audio program 202 is performed according to the present invention by: at step 204 decreasing the volume of the front speakers 206, 208, and 210 while perhaps slightly increasing the volume of rear speakers 212 and 214 to create the impression that the source of program 200 is moving rearward. At step 216, the front channels 206-210 of program 202 are increased as the rear channels 212-214 of program 200 are decreased apparently moving the source of program 200 further rearward while program 202 appears to be entering from the front. At step 218, the rear channels 212-214 of program 202 are increased to bring program 202 to its full volume on all channels while program 200 if completely faded out. Thus the illusion is created to a listener ("L" surrounded by a circle in FIGS. 2 through 5) that the first program 200 exited through the back of the room while its replacement, program 200, entered through the front of the room.

Figure 3:
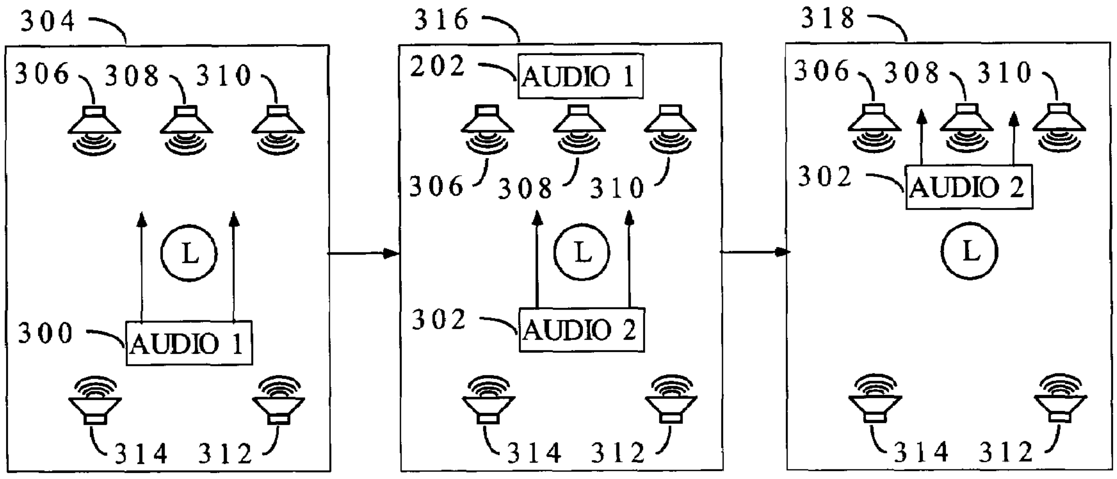
FIG. 3 provides a diagram of the perceived movement of audio programs in a second example.

In a second example shown in FIG. 3, as the first audio program 300 wraps up at step 304, the volumes of the rear speakers 312 and 314 are reduced while the volumes of front speakers 306, 308, and 310 are slightly increased to create the illusion that the source of the sound is moving forward. At step 316, as program 300 is faded out of the rear channels 312 and 314, program 302 is faded into rear channels 312 and 314. Simultaneously, program 300 begins to fade in front channels 306, 308, and 310 to give the illusion that program 300 is exiting through the front of the room. At step 318, the front volume of program 302 is increased in front channels 306,

308, and 310 to its normal levels to give the illusion that program 302 has entered from the back of the room.

Figure 4:
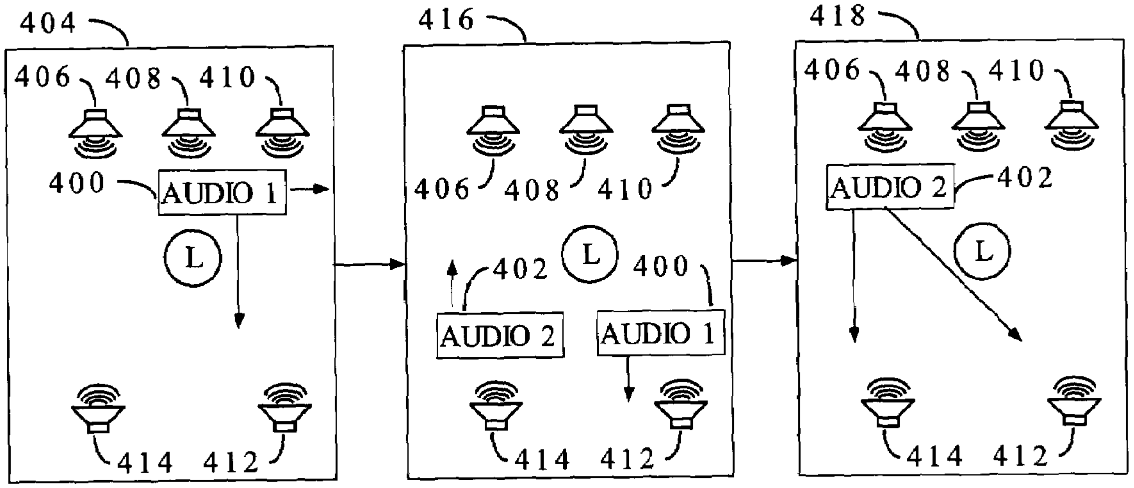
FIG. 4 provides a diagram of the perceived movement of audio programs in a third example.

In another example, as shown in FIG. 4, towards the end of program 400, at step 404, movement is started to the right and to the rear by reducing the volumes of left channels 406 and 414 while increasing the volumes of right channels 410 and 412. Program 400 is then moved towards the right rear corner of the room by decreasing the volume of right front channel 410. At step 416, as program 400 is driven out of the right rear corner of the room, program 402 is brought in through the left rear corner and moved into the right front corner by first bringing up the volume of program 402 in channel 414 and, after a prescribed delay, increasing the volume of program 402 in right front channel 406 while fading channel 414. At step 418, as program 400 fades out of right rear channel 412, the remaining channels 408, 410, 412 and 414 of program 402 are increased to their normal respective volumes to center program 402 in the room.

Figure 5:
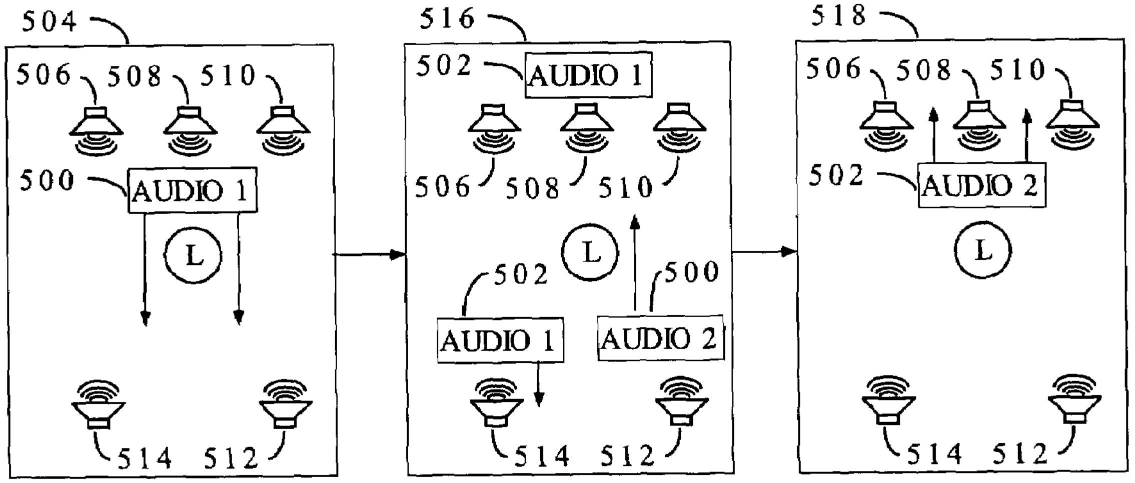
FIG. 5 provides a diagram of the perceived movement of audio programs in a fourth example.

In still another example, as shown in FIG. 5, program 500 is ushered out of the rear of the room, perhaps biased somewhat to the left, by decreasing the front channels 506, 508, and 510 starting at step 504. As program 500 exits the rear of the room by decreasing the volume of channels 512 and 514, program 502 is brought forward, from the rear of the room by first increasing rear channels 512 and 514 of program 502 at step 516. Finally, program 502 is moved forward by increasing channels 506, 508, and 510 of program 502 until all of the channels 506-514 are at their proper relative volumes at step 518.

Figure 8:
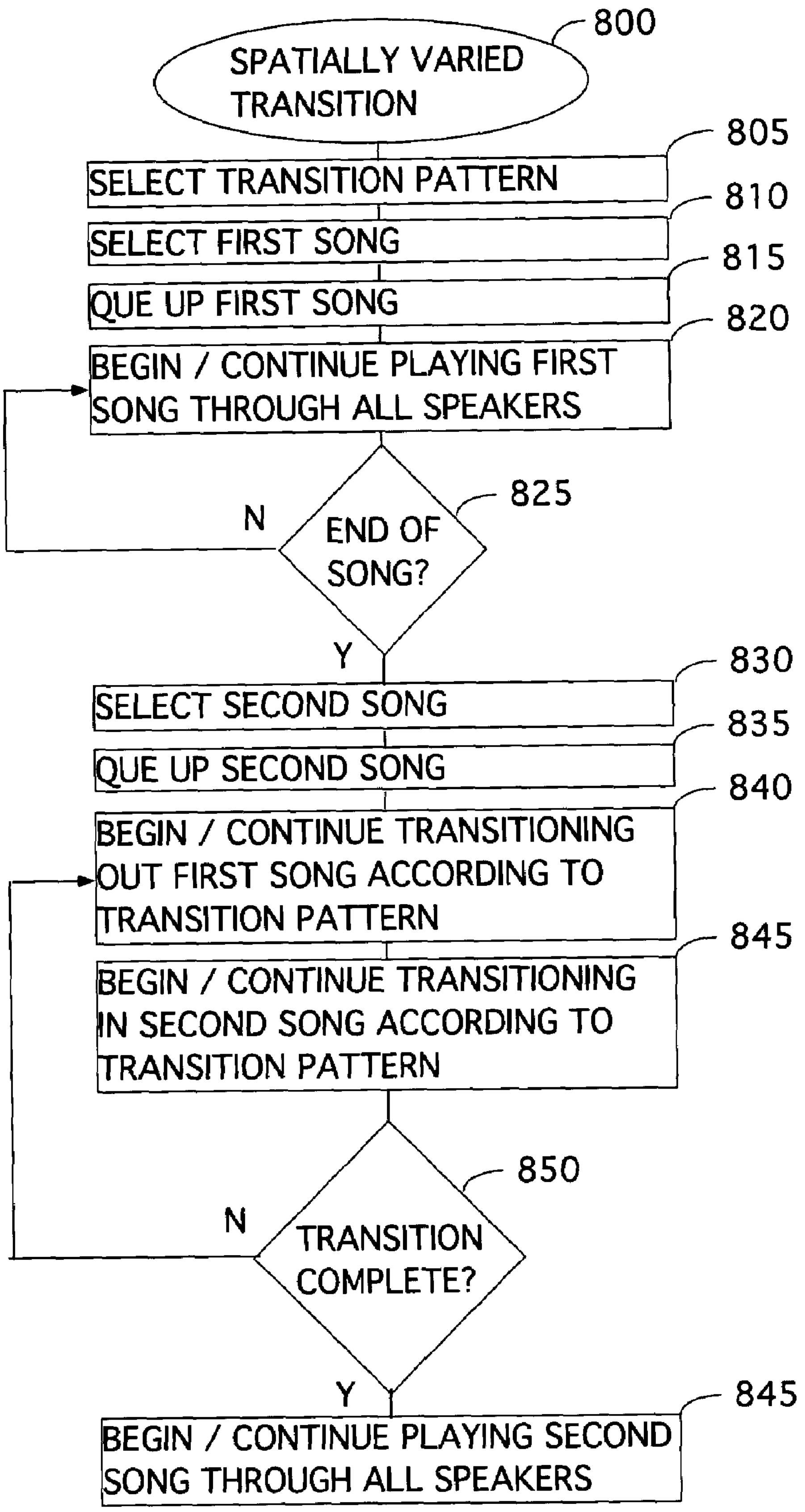
FIG. 8 provides a preferred operating logic for an embodiment of the instant system for controlling audio transitions.

Turning now to FIG. 8, there is provided another aspect of the instant invention 800 which is implemented digitally within a computer or similar device. As a first step 805, a transition pattern will be selected. This pattern will preferably be stored in digital form on a magnetic or optical disk, but could also be stored in RAM, ROM, EPROM, flash RAM, non-volatile, RAM, etc. The stored transition pattern will preferably specify how the music volume will vary in each of the attached speakers as the first/currently playing song ends and the second/subsequent song begins. The transition pattern could, for example, specify the duration of the transition and how the volume is to vary in time for each of the speakers in the audio network so as to create the desired spatially varying transition effect. As a specific example, a perception of "circling" may be created by placing speakers in each corner of a room, and then playing an audio work through one speaker at a time, with the speakers being selected sequentially in a clockwise or counterclockwise direction. Of course, this effect could be enhanced if the sound source is faded from one speaker to the next, rather than using an abrupt transition. In either case, the transition pattern might contain a list of the speakers, say, in clockwise order together with a rotation rate or, alternatively, a length of time sound is to be emitted from each speaker. Additionally, parameters such as a decay/gain rate of the sound (assuming that the actual decay/gain of the audio work is to be overridden), reverb level, and whether other audio effects will be added will all preferably additionally be indicated as part of the transition pattern. Those of ordinary skill in the art will recognize that there are any number of ways that this sort of performance information might be stored.

Note that, in the preferred embodiment, the patterns that are applied to the ending and the beginning audio works will be complementary in some sense. That is, whatever spatial pattern is utilized to fade-down the outgoing audio work a related (similar or opposite) pattern will preferably used to fade-up the subsequent work. For example, one preferred embodiment utilizes a "chase" where the outgoing audio work is spatially "pursued" by the incoming work by moving both sequentially through the available speakers, wherein at least one speaker separates the two audio work at any one time. As another example, and as been discussed previously, in some instances the outgoing audio work might be faded to the back of the room while the incoming work appears at the front or the incoming work might appear at the back of the room after the previous work has ended, etc.

Next, a first song will be selected and queued up to play (steps 810 and 815). Step 815 might involve physically mounting an LP or compact disk, beginning to read digital music from a disk file, etc. As a next preferred step, the selected song will be preferably be played (step 820) through all of the speakers in the system. Of course, if the song itself is so arranged, or the moderating DJ desires, the first song might not actually be played though "all" of the speakers, but instead might be played though a subset of them.

This song will be played until the end of the song is sensed (step 825). Of course, the "end" of the song will preferably be sensed some period of time (e.g., a few seconds) before the actual end of the song to allow time for the transition effect to be audibly implemented before the end of the recording is actually reached.

Once the end of the currently playing song is detected, a second or subsequent song will be selected and queued up (steps 830 and 835). Of course, the selection/queuing of the subsequent song need not necessarily be delayed until the termination of the currently playing song but could instead be performed at any time before that. As has been explained previously, the step of "queuing" the second song refers to the execution of whatever steps are necessary to prepare the musical work for playing, whether those steps might include placing an LP record on a turn table, opening a computer file, etc.

As a next preferred step, the currently playing song will be transitioned out (step 845) according to the transition pattern read previously (step 805). In a preferred embodiment and as is generally illustrated in FIG. 8, the second song will be simultaneously transitioned in (step 845) while the first song is transitioned out, although that is not strictly required. It is certainly possible that the first song might be completely transitioned out before the second song is begun. However, in the preferred arrangement there will be some audio overlap between the exiting and entering songs, thereby tending to enhance the selected transition effect.

Preferably, the transitioning will be continued (step 850) until the second song has replaced the first, after which it is expected that the second song will continue to be played through all of the available speakers (step 845), or at least through those speakers for which there is audio information available. That is, the composer might have intended that only two (of, say, five) speakers be utilized by a musical work, in which case, it would be expected that step 845 would include playing the musical work through only two of the five speakers.

Figure 9:
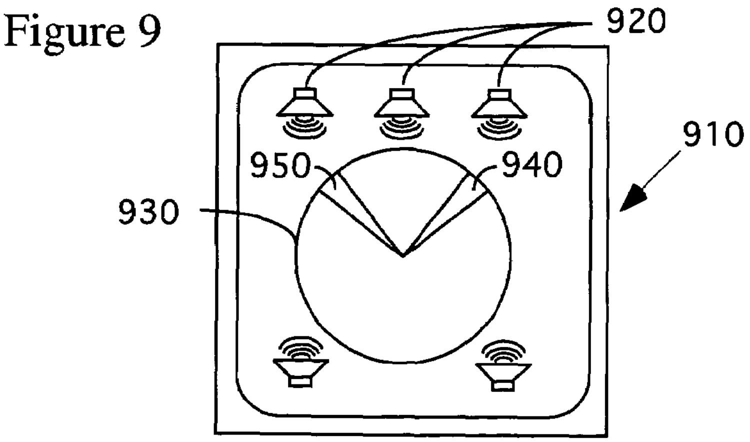
FIG. 9 illustrates an embodiment of the instant invention, wherein a graphical representation of the sound distribution is displayed in real-time to the operator.

In still another preferred embodiment, there is provided a method substantially as described above, but wherein a graphical representation of the spatial distribution of the sound image of the current song(s) is continuously displayed on an attached computer screen. As is generally illustrated in FIG. 9, in a preferred arrangement a computer display device 910 will exhibit icons 920 (or any other indicia which could represent the speakers) which are preferably positioned on the screen in an arrangement which reflects the physical placement of the speakers 14-24 within the room. Drawn on computer display device 910 are preferably rays 940 and 950 which correspond to the audio programs that are beginning and ending, respectively. That is, ray 940 indicates the spatial location of the beginning audio program, and ray 950 indicates the spatial location of the ending audio program. In the preferred embodiment, when one of the rays is pointed directly at one of the speaker icons 920 that will represent the case where the associated audio program is being heard almost exclusively through the corresponding speaker. That being said, it should be noted that in some embodiments the widths of the rays 940 and 950 will be varied to represent the case where each sound source is heard through multiple speakers in the room, with the width of the ray preferably being chosen so that it includes all speakers which, at that instant, are playing sound from the corresponding audio program. In still other arrangements, the width of the ray might correspond to the average volume level of the audio program with, for example, wider rays corresponding to a higher volume level, thereby making it easy to tell which audio program is increasing in volume and which is fading. Finally, those of ordinary skill in the art will recognize that the color, length, etc., of the ray can be made to vary depending on any parameter that would be of interest to the user.

In the preferred arrangement, calibration ring 930 will be drawn on the computer screen 910. This circle 920 might be marked with, for example, degree increments (i.e., zero to 360) or some other metric. Obviously, this sort of display would allow the user/DJ to quickly estimate the approximate aural position of audio program within the room at any instant.

In operation, the rays 940 and 950 will move on the screen 910 at least during the transition period between two successive songs. The display of FIG. 9 might be appropriate where the ending audio program is designed to "chase" the new audio program around the room (i.e., the two programs are spatially separated by about a 90 degree angle and are moving in a counter-clockwise direction). In this scenario, the DJ would observe the two rays 940 and 950 circling around the center point as the moment of transition occurred.

Obviously, there are an unlimited number of variations of this embodiment that might be implemented. Some additional examples include making the name of each audio program a part of the corresponding ray 940/950 and/or using the text name of the audio program as the ray (e.g., the phrase "Wooly Bully" would circle around the screen in place of ray 940); successively highlighting icons 920 as the sound moves from speaker to speaker (which might be used in conjunction with or instead of rays 940/950); other standard visual effects could be used in conjunction with the transition (e.g., the graphic display could be made to "slide off" of the monitor 910 in the same direction as the exiting audio program, thereby revealing a new screen underneath), etc.

Those of ordinary skill in the art will recognize that in some cases it would be beneficial to make the screen display 910 visible to the participants by, for example, projecting it onto a wall or ceiling. In that case, the video presentation will preferably be chosen to complement or enhance the chosen audio program, thereby potentially increasing the intensity of the experience for the participants.

Further, and according to another preferred embodiment, there is provided an invention substantially as described above, but wherein some degree of interactivity is provided to the user so that the user can override or augment the pre-programmed transition. That is, and taking for example the embodiment of FIG. 9, in some cases a user will be given the option of, say, using a mouse or other computer pointer to "grab" one (or both) of the rays 940/950 and manually "drag" the selected ray(s) around the circle 930, thereby increasing the speed of rotation of the transition, reversing its direction, causing it to rapidly alternate direction, etc. In other instances, the user might be allowed to cause the transition to bounce from speaker to speaker, etc. by successively "pointing" to the corresponding screen icon. In general, it is preferred that some sort of pre-programmed transition be presented to the user and the user be given the option of overriding that transition. In other instances, the user might be presented with the graphical display of FIG. 9 and allowed to improvise his or her own spatial transition in real time. Note that, for purposes of the instant disclosure, whether the "transition pattern" is completely predefined or whether it is provided by the user in real time is immaterial to the operation of the instant invention. Thus, the phrase "transition pattern" will be used here to refer to both predefined transition patterns and transition patterns that originate in whole or in part with the user. Those of ordinary skill in the art will recognize that this sort of functionality could dramatically enhance the entertainment value of the instant system.

It should be noted that inventive method can be used in an infinite number of ways to impart apparent motion during song-to-song transitions. As a specific example of how one such scheme might be implemented, a suggestion of circular motion can readily be obtained by modulating the relative volumes according to the standard equation that describe a circle. For example, it is possible to give the impression that the audio source is moving circularly about the room in a clockwise direction by adjusting the volume of the corner channels according to the following scale factors:

$$VOL_{LF}=0.5+0.5*\cos(x);$$

$$VOL_{RF}=0.5+0.5*\sin(x);$$

$$VOL_{RR}=0.5-0.5*\cos(x); \text{ and,}$$

$$VOL_{LR}=0.5-0.5*\sin(x),$$

where $VOL_{LF}$ is the volume of the left front channel, $VOL_{RF}$ is the volume of the right front channel, $VOL_{RR}$ if the volume of the right rear channel, $VOL_{LR}$ is the volume of the left rear channel and x is varied from 0 to 360 degrees. Depending on how quickly "x" is allowed to vary between 0 and 360 degrees (e.g., over ten seconds), different speeds of "rotation" may be created. By also modifying the coefficients of the above equations, a number of additional effects could be created, such as spiraling a program into, or out of, the room. Virtually any geometric form may be traced by an audio program in a similar manner.

As will be apparent to those skilled in the art, the process of moving audio through the various channels is preferably performed in an automated fashion by manipulating the volume controls and the reverb controls with a computer, such as the computer 12 as shown in FIG. 1. Alternatively, the spatially varying transitions (including volume changes, reverb changes, mixing proportions, etc.) could readily be calculated digitally for each channel and the multi-channel digital information then transmitted to a digital amplifier or other sound reproduction equipment.

For purposes of the present invention, the term computer is to be interpreted broadly to include desktop or rack-mount computers, microprocessors, microcontrollers, processors incorporated in programmable logic or discrete logic, or even analog logic/computers.

It should be noted and remembered that, for purposes of the instant invention, the only requirement of the computer 12 is that it must minimally be an active device, i.e., one that is programmable in some sense, that it is capable of recognizing signals from a bed mat or similar patient sensing device, and that it is capable of initiating the sounding of one or more alarm sounds in response thereto. Of course, these sorts of modest requirements may be satisfied by any number of programmable logic devices ("PLD") including, without limitation, gate arrays, FPGA's (i.e., field programmable gate arrays), CPLD's, EPLD's, SPLD's, PAL's, FPLA's, FPLS, GAL, PLA, FPAA, PSoC, SoC, CSoC, ASIC, etc., as those acronyms and their associated devices are known and used in the art. Further, those of ordinary skill in the art will recognize that many of these sorts of devices contain microprocessors integral thereto. Thus, for purposes of the instant disclosure the terms "computer", "processor," "microprocessor," "micro-controller", and "CPU" should be interpreted to take the broadest possible meaning herein, and such meaning is intended to include any PLD or other programmable device of the general sort described above.

It should also be noted that the inventive effects may be performed in any number of channels of audio program, except in a monaural environment. In a stereo environment the illusion of motion is constrained to a line defined by the two speakers, thus for example, one song might exit to the left while a second song enters from the right. Of course, those of ordinary skill in the art will recognize that some illusion of "depth" can be created in a stereo environment, at least in the direction of the speakers relative to the listener, through the use of effects such as reverb. As more channels are added, the range of possible effects increases. As noted above, five channel surround systems area quite popular and, while not limited to such systems, the present invention is well suited to five channel surround environments.

Finally, it should also be noted that the inventive song-to-song transitions may be further enhanced through the addition of sound effects, particularly effects associated with motion. Like the program audio, apparent motion may be imparted to such sound effects by proper manipulation of the relative volumes between the channels and optionally through the use of delay. By way of example and not limitation, a "zwoosh" or similar sound may be moved through the audio channels along with the program audio from either the exiting program, the entering program, or both, to further enhance the illusion of movement, or a song could be spiraled out through the center of the room as, discussed above, while accompanied by a flushing sound.

Thus, the present invention is well adapted to carry out the objects and attain the ends and advantages mentioned above as well as those inherent therein. While the inventive device has been described and illustrated herein by reference to certain preferred embodiments in relation to the drawings attached hereto, various changes and further modifications, apart from those shown or suggested herein, may be made therein by those skilled in the art, without departing from the spirit of the inventive concept, the scope of which is to be determined by the following claims.

What is claimed is:

1. A method of generating a sound transition between a first audio work and a second audio work in a multi-channel surround sound environment, wherein said first audio work is ending and said second audio work is beginning, and wherein there is provided at least four audio speakers arrayed in a spaced-apart configuration on at least four different sides of a listener, comprising:

a. selecting a first transition pattern for said first audio work:

(a1) wherein said first transition pattern is comprised of at least four separate first transition channel patterns, each of said at least four first transition channel patterns utilizing a different one of said at least four audio speakers, and, (a2) wherein said at least four first transition channel patterns cooperate together to create an impression of movement of said first audio work to the listener, said impression of movement of said first audio work at least moving between each of said at least four different sides of the listener;

b. selecting a second transition pattern for said second audio work, said transition patterns for said first audio work and second audio work providing an audio transition between said first audio work and said second audio work, (b1) wherein said second transition pattern is comprised of at least four separate second transition channel patterns, each of said at least four second transition channel patterns utilizing a different one of said at least four audio speakers, and, (b2) wherein said at least four first transition channel patterns and said at least four second transition channel patterns cooperate together to create an impression of movement of said first and second audio works to the listener, said impression of movement at least moving between each of said at least four different sides of the listener;

c. playing said first audio work through said at least four audio speakers according to said first transition pattern until said first audio work is no longer audible; and, d. playing said second audio work through said at least four audio speakers according to said second transition pattern until said first audio work is no longer audible and thereafter continuing to play said second audio work through said plurality of audio speakers according to the desires of the listener.

2. A method according to claim 1, wherein the steps of selecting said first and said second transition patterns is accomplished by selecting a master transition pattern which includes both said first and said second transition patterns therein.

3. A method according to claim 1, wherein said first transition pattern is selected from a group consisting of:

(a1) a front-to-back transition pattern, (a2) a left side to right side transition pattern, or, (a3) a circling transition pattern.

4. A method according to claim 1, further comprising the steps of:

e. forming a graphical representation of said first transition pattern and said second transition pattern, wherein said graphical representation reflects at least approximately said impression of movement of said first and second audio works within said at least four speakers; and, f. displaying on a computer display device said graphical representation of said first transition pattern and said second transition pattern during the playing of said first and second audio works.

5. A method according to claim 1, further comprising the steps of:

e. forming a graphical representation of said first transition pattern, said graphical representation having a least indicia thereon representing each of said at least four audio speakers;

f. displaying on a computer display device said graphical representation of said first transition pattern during the playing of said first audio work.

6. A method according to claim 5, wherein said indicia of said at least four audio speakers are at least approximately spaced apart on said computer display device proportionally to an actual spacing of said at least four audio speakers.

7. A method according to claim 5, wherein step (f) comprises the step of displaying on a computer display device said graphical representation of said first transition pattern during the playing of said first audio work, wherein said display operates at least approximately in real-time and wherein said displayed graphical representation is continuously updated to reflect the operation of said first transition pattern.

8. A method according to claim 1, further comprising the steps of:

e. forming a graphical representation of said second transition pattern, said graphical representation having at least indicia thereon representing each of said at least four audio speakers; and, f. displaying on a computer display device said graphical representation of said first transition and said second transition pattern during the playing of at least a portion of said second audio work.

9. A method according to claim 1, wherein at least a portion of said first transition pattern is provided by a user.

10. A method according to claim 1, wherein at least a portion of said second transition pattern is provided by a user.

11. A method of transitioning between a first audio work and a second audio work in a multi-channel surround sound environment, wherein said first audio work is ending and said second audio work is beginning, and wherein there is provided at least four audio speakers arrayed in a spaced-apart configuration on at least four different sides of a listener, comprising:

a. selecting a first transition pattern for use with said first audio work, said first transition pattern comprising at least four different first audio channel patterns, with each one of said first audio channel patterns corresponding to a different one of said at least four audio speakers, said first transition pattern providing an audible impression of movement of said first audio work when said first audio work is playing according to said first transition pattern through said at least four audio speakers, wherein said impression of movement is at least moving between each of said at least four different sides of the listener;

b. selecting a second transition pattern for use with said second audio work, said second transition pattern comprising at least four different second audio channel patterns, with each one of said second audio channel patterns corresponding to a different one of said at least four audio speakers, said second transition pattern providing an audible impression of movement of said second audio work when said second audio work is played according to said second transition pattern through said at least four audio speakers, wherein said impression of movement is at least moving between each of said at least four different sides of the listener, said second transition pattern being selected to be complementary to said first transition pattern;

c. playing said first audio work through said at least four audio speakers according to said first transition pattern until said first audio work is no longer audible;

d. playing said second audio work through said at least four audio speakers according to said second transition pattern until said first audio work is no longer audible and thereafter continuing to play said second audio work through said at least four audio speakers according to the desires of the listener.

12. A method according to claim 11, wherein said at least four sides of the listener are selected from a group consisting of a left side, a right side, a front side, and a rear side.

13. A method according to claim 11, wherein the steps of selecting said first and said second transition patterns is accomplished by selecting a master transition pattern which includes both said first and said second transition patterns therein.

14. A method according to claim 11, wherein said first transition pattern is selected from a group consisting of:

(a1) a front-to-back transition pattern, (a2) a left side to right side transition pattern, or, (a3) a circling transition pattern.

15. A method according to claim 11, further comprising the steps of:

e. forming a graphical representation of said first transition pattern, wherein said graphical representation reflects at least approximately said impression of movement of said first audio within said at least four speakers; and, f. displaying on a computer display device said graphical representation of said first transition pattern during the playing of said first audio work.

16. A method according to claim 15, wherein step (f) comprises the step of displaying on a computer display device said graphical representation of said first transition pattern during the playing of said first audio work, wherein said display occurs at least approximately in real-time and wherein said displayed graphical representation is continuously updated to reflect the operation of said first transition pattern.

17. A method according to claim 11, further comprising the steps of:

e. forming a graphical representation of said second transition pattern, wherein said graphical representation reflects at least approximately said impression of movement of said second audio work within said at least four speakers; and, f. displaying on a computer display device said graphical representation of said second transition pattern during the playing of said second audio work.

18. A method according to claim 11, further comprising the steps of:

e. forming a graphical representation of said first transition pattern, said graphical representation having at least indicia thereon representing each of said at least four audio speakers;

f. displaying on a computer display device said graphical representation of said first transition during the playing of said first audio work.

19. A method according to claim 18, wherein said indicia of said at least four audio speakers are at least approximately spaced apart on said computer display device proportionally to an actual spacing of said audio speakers.

20. A method according to claim 11, wherein at least a portion of said first transition pattern is provided by a user.

21. A method of generating a sound transition between a first audio work and a second audio work in a multi-channel surround sound environment, wherein said first audio work is ending and said second audio work is beginning, and wherein there is provided at least four audio speakers arrayed in a spaced-apart configuration on at least four different sides of a listener, comprising:

a. selecting a first transition pattern for said first audio work, wherein, (a1) said first transition pattern separately utilizes each of said at least four different speakers to create a first impression of movement of said first audio work to the listener, said first impression of movement of said first audio work at least moving between each of said at least four different sides of the listener;

b. selecting a second transition pattern for said second audio work, said first transition pattern and said second transition pattern providing an audio transition between said first audio work and said second audio work, wherein:

(b1) said second transition pattern separately utilizes each of said at least four different speakers to create a second impression of movement of said second audio work to the listener, said second impression of movement of said second audio work at least moving between each of said at least four different sides of the listener;

c. playing said first audio work through said at least four audio speakers according to said first transition pattern until said first audio work is no longer audible; and, d. playing said second audio work through said at least four audio speakers according to said second transition pattern until said first audio work is no longer audible and thereafter continuing to play said second audio work through said plurality of audio speakers according to the desires of the listener.

22. A method according to claim 21, wherein the steps of selecting said first and said second transition patterns is accomplished by selecting a master transition pattern which includes both said first and said second transition patterns therein.

23. A method according to claim 21, wherein said first transition pattern is selected from a group consisting of:

(a1) a front-to-back transition pattern, (a2) a left side to right side transition pattern, or, (a3) a circling transition pattern.

24. A method according to claim 21, further comprising the steps of:

e. forming a graphical representation of said first transition pattern, wherein said graphical representation reflects at least approximately said impression of movement of said first audio within said at least four speakers; and, f. displaying on a computer display device said graphical representation of said first transition pattern during the playing of said first audio work.

25. A method according to claim 24, wherein step (f) comprises the step of displaying on a computer display device said graphical representation of said first transition pattern during the playing of said first audio work, wherein said display occurs at least approximately in real-time and wherein said displayed graphical representation is continuously updated to reflect the operation of said first transition pattern.

26. A method according to claim 21, further comprising the steps of:

e. forming a graphical representation of said second transition pattern, wherein said graphical representation reflects at least approximately said impression of movement of said second audio work within said at least four speakers; and, f. displaying on a computer display device said graphical representation of said second transition pattern during the playing of said second audio work.

27. A method according to claim 21, further comprising the steps of:

e. forming a graphical representation of said first transition pattern, said graphical representation having at least indicia thereon representing each of said at least four audio speakers;

f. displaying on a computer display device said graphical representation of said first transition during the playing of said first audio work.

28. A method according to claim 27, wherein said indicia of said at least four audio speakers are at least approximately spaced apart on said computer display device proportionally to an actual spacing of said audio speakers.

29. A method according to claim 21, wherein at least a portion of said first transition pattern is provided by a user.

30. A method according to claim 21, wherein said at least four sides of the listener are selected from a group consisting of a left side, a right side, a front side, and a rear side.

* * * * *

UNITED STATES PATENT AND TRADEMARK OFFICE

CERTIFICATE OF CORRECTION

PATENT NO. : 7,424,117 B2
APPLICATION NO. : 10/647494
DATED : September 9, 2008
INVENTOR(S) : Herberger et al.

It is certified that error appears in the above-identified patent and that said Letters Patent is hereby corrected as shown below:

Title Page, Item (75) Inventors: The second named inventor's first name is corrected to read "Titus".

Signed and Sealed this

Second Day of December, 2008

JON W. DUDAS
*Director of the United States Patent and Trademark Office*